(12) United States Patent
Harris

(10) Patent No.: US 6,239,035 B1
(45) Date of Patent: May 29, 2001

(54) SEMICONDUCTOR WAFER FABRICATION

(75) Inventor: Chester Lamar Harris, Orlando, FL (US)

(73) Assignee: Agere Systems Guardian Corporation, Berkeley Heights, NJ (US)

( * ) Notice: Subject to any disclaimer, the term of this patent is extended or adjusted under 35 U.S.C. 154(b) by 0 days.

(21) Appl. No.: 09/404,702

(22) Filed: Sep. 23, 1999

Related U.S. Application Data

(63) Continuation-in-part of application No. 08/891,438, filed on Jul. 18, 1997, now abandoned.

(51) Int. Cl.$^7$ .................................................. H01L 21/311
(52) U.S. Cl. ........................................... 438/703; 438/761
(58) Field of Search ..................................... 438/703, 761

(56) References Cited

U.S. PATENT DOCUMENTS 5,618,380 * 4/1997 Siems et al. ........................... 438/14

* cited by examiner

*Primary Examiner*—John F. Niebling
*Assistant Examiner*—Lynne A. Gurley
(74) *Attorney, Agent, or Firm*—Peter V. D. Wilde; Thomas, Kayden, Horstemeyer & Risley LLP

(57) ABSTRACT

A process for the manufacture of semiconductor integrated circuits is described in which the defect density due to conductive particle debris formed at the edge of the wafer is reduced by burying the edges of the metal layers in a tapered step configuration, so that the maximum steps in the inter-level and final dielectric layers are essentially the same as the thickness of the metal layers.

12 Claims, 5 Drawing Sheets

SEMICONDUCTOR WAFER FABRICATION

RELATED APPLICATION

This application is a continuation-in-part of my earlier application Ser. No. 08/891,438, filed Jul. 18, 1997, now abandoned

FIELD OF THE INVENTION

This invention relates to the manufacture of semiconductor wafers and more specifically to improving semiconductor device yield by reducing particle defects.

BACKGROUND OF THE INVENTION

In a typical wafer fabrication process device defects are frequently caused by metal particulates produced during the patterning of the metal layers and the interlevel dielectric layers. Particulates are produced from a variety of sources but an especially troublesome source is the edge of the wafer where the edge of a completed metal layer may be exposed during subsequent processing. The problem is exacerbated by the conventional edge bead removal procedure which exposes prior metal levels and allows edge debris from those prior metal levels to deposit on the wafer during fabrication. This metal edge debris causes shorts in the integrated circuit being formed. These shorts are detected after processing of the integrated circuit is completed and much of the cost of processing these defective devices is wasted.

SUMMARY OF THE INVENTION

Recognizing this problem I have developed a technique for ensuring that the edges of metal levels remain covered during the entire process sequence, thus preventing metal edge debris from forming. This goal is achieved by burying the metal edges in the interlevel dielectrics. This "buried edge" process protects each underlayer as new levels are formed, and prevents exposure of previously formed metal edges even during window etch. According to the invention this result is achieved by etching a peripheral ring at the edge of the wafer in each metal level, and depositing each interlevel dielectric so that it covers the edge of underlying metal layer. A peripheral ring at the edge of the wafer in each interlevel dielectric layer is also removed, but the width of the ring of interlevel dielectric material removed is smaller than the width of the ring of metal removed so that each interlevel dielectric layer extends closer to the wafer edge than the metal layers, thereby insuring that the edge of each metal layer is buried. The objective in this embodiment is to leave the periphery of the wafer devoid of layer buildup so that during wafer handling and clamping there is no deposited material to chip off and form debris. The technique described essentially replaces the edge bead removal process that is typically used in wafer fabrication.

In removing the peripheral ring of each metal layer, the size of the peripheral ring in each sequential metal layer is decreased, which results in a tapered step thus further ensuring that the edge of each metal layer is well protected during subsequent processing.

DETAILED DESCRIPTION

Figure 1:
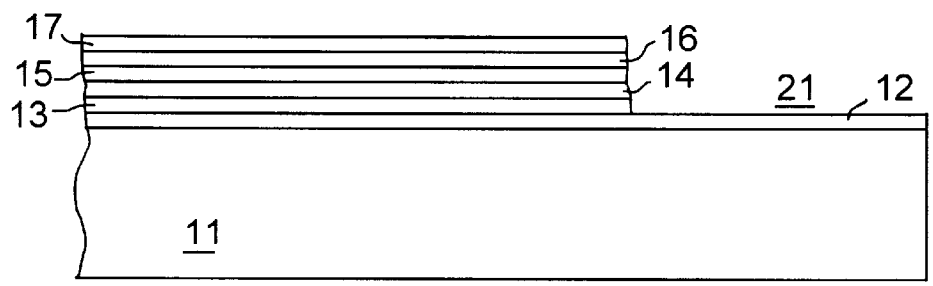
FIG. 1 is a schematic diagram of a typical processed semiconductor wafer in which polysilicon and two levels of metal are used, showing the exposure of metal edges during the processing sequence and illustrating the potential for forming edge debris.

In the processes described below the wafer being processed is a silicon wafer. However, other semiconductor wafers, such as III–V or II–VI semiconductor wafers can be processed in a similar manner and the principles of the invention are equally applicable to these materials. In silicon processing, the most typical semiconductor processing, the first layer is a grown oxide. Subsequent layers are the gate oxide layer, one or more polysilicon layers and one or more metal layers, e.g. aluminum. The process sequence described to demonstrate the invention is a single poly, two metal, step sequence. Obviously the features described will apply to other processes that use double poly, and/or one, two, or even three metal levels in addition to the poly level(s). The interlevel dielectric is typically deposited $SiO_2$ but other insulating materials such as $Si_3N_4$ and spin on insulators such as various glass compositions and polyimides, etc., can also be used to obtain the advantages of the invention as described.

The field oxide layer is typically patterned using a LOCOS type process as is well known. The first conductor level, typically polysilicon, is deposited by CVD or other suitable process and patterned using standard photolithography. A photoresist layer is spun over the polysilicon layer with the result that an edge bead forms at the edge of the wafer. The formation of the edge bead is a consequence of fluid dynamics, e.g. surface tension, at a surface discontinuity and the formation of edge beads is largely unavoidable. The consequence of the edge bead is well known. After photoresist exposure, development and stripping, a residue of unwanted photoresist may remain at the edge of the wafer and cause masking of a small edge region that later produces debris. The accumulation of residues from several layers of photoresist edge beads produces particle defects and interferes with normal processing.

Although the photoresist edge bead typically cannot be avoided, it can be eliminated by an edge bead removal process. Edge bead removal processes are standard in the art. Two approaches are common. The mask for the photoresist exposure can mask (for positive resist) or expose (for negative resist) the edge bead region, so that the photoresist at the edge of the wafer is removed during development. The typical development may not remove all of the edge bead during clearing of the features to be exposed, but later photoresist stripping will typically complete the edge bead removal. Alternatively, a chemical etch is used to remove the edge bead prior to photoresist exposure and development. In this process the edge bead on the top side of the wafer, the side being processed, is exposed to a jet of photoresist stripping fluid. Typically a baffle is arranged at the edge of the wafer while the wafer is spun under the stream of stripping fluid. The baffle and/or the jet can be adjusted to obtain the desired width of edge bead removed. Typically several millimeters of photoresist at the edge of the wafer is removed.

As will become evident from the following description the removal of edge beads in the normal manner results in a stacking of the edges of all the layers, and exposes the edges of previously formed layers. When these exposed layers are metal the potential for metal debris forming at the edge of the metal layers during later processing, and producing conductive particle defects in the finished devices, is significant. This problem results from normal processing in the following way.

FIG. 1 shows a semiconductor substrate 11 and a layer 12 being processed, typically an $SiO_2$ layer. The oxide layer 12 is the field oxide and is patterned by growing the layer on a surface masked with regions of silicon nitride. This part of the process proceeds in the region of the wafer removed from the edge and is not shown. The first conductor level 13, in the typical process a polysilicon layer, is deposited by CVD or other suitable method. The polysilicon layer, and other subsequent layers in the process, are patterned using standard photolithography techniques. In some processes a hard mask, i.e. an oxide mask, may be used to pattern the polysilicon layer but that alternative is straightforward and well known in the art. A strip of the polysilicon layer is removed from the edge of the wafer during the edge bead removal operation. The width "S" of this strip, as measured from the wafer edge to the edge of the polysilicon layer 13, is typically in the range of 1–10 mm.

The first interlevel dielectric layer 14 is shown deposited over the patterned polysilicon layer 13 and also spaced at distance S from the edge of the wafer 11 after the edge bead portion of the photoresist layer used to pattern it has been removed. The first metal level 15 is shown deposited over the first interlevel dielectric 14 and the exposed field oxide 12. The metal level may be aluminum or other suitable conductor, and is deposited by evaporation or other technique. The photoresist layer used to pattern the first metal level is spaced again at distance S from the edge of the wafer. After patterning the first metal level 15, the edges of the layers 13, 14 and 15 are shown essentially aligned, at spacing S from the edge of the wafer. The second interlevel dielectric layer 16 has the same edge portion S removed as in the former photoresist patterning operations. Finally the second level metal layer 17 is formed, which is also spaced at distance S from the wafer edge. It is evident that the edges of each of the metal layers 13, 15 and 17 are exposed, and present the potential for formation of conductive particle debris. It is also evident that during the processing to reach this stage, the edges of these metal layers were exposed. This exposure of the edges of the metal levels during processing is a consequence of the edge bead removal operation in which all layers are terminated at the same distance (here "S") from the edge of the wafer.

An improved process in which the edges of the metal layers are buried is described in U.S. Pat. No. 5,618,380, issued Apr. 8, 1997. This process will be described in conjunction with FIG. 2. Referring first to FIG. 3, a plan view of a typical wafer 41 with chip sites 42 is shown. Dimensions $S_1$ and $S_2$ are spacings from the wafer edge that are used in the following description. In subsequent embodiments, $S_1$ varies between values $S_a$, $S_b$ and $S_c$, or $S_{a'}$, $S_{b'}$, and $S_{c'}$.

Figure 2:
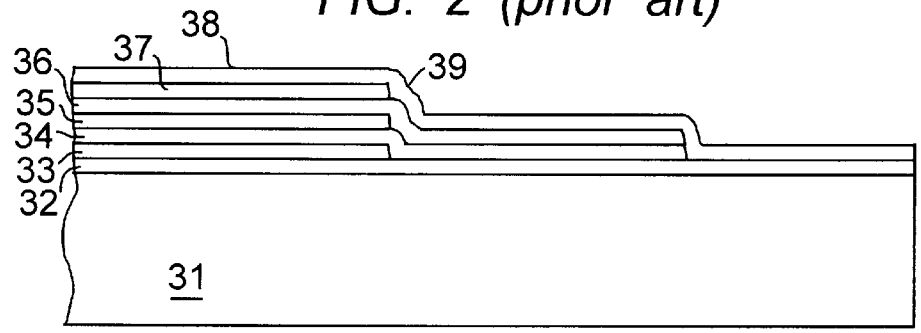
FIG. 2 is a schematic view of a processed semiconductor wafer having vertically stacked metal layers with metal edges buried.
Figure 3:
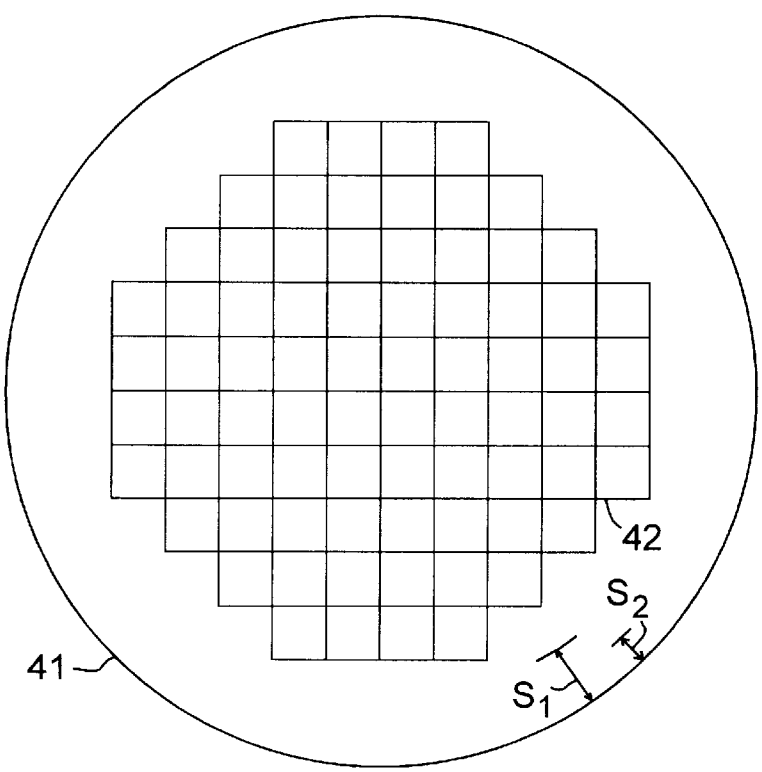
FIG. 3 is a schematic diagram showing dimensions used in the description of the invention.

Referring to FIG. 2, substrate 31 is shown with field oxide 32 and polysilicon layer 33. The mask for patterning the polysilicon layer is shown is spaced a distance $S_1$ from the edge of the wafer. The first interlevel dielectric layer is shown at 34 in FIG. 2, deposited over the patterned polysilicon layer 33.

The first interlevel dielectric layer is patterned with the edge of the photomask spaced at a distance $S_2$ from the edge of the wafer, where $S_2<S_1$. The preferred technique for achieving the spacings $S_1$ and $S_2$ is by photolithographic patterning. However, as indicated above, the photoresist can be removed by dissolving with a solvent prior to exposure using a jet of solvent directed at the edge of the wafer. The apparatus used for this can be adjusted to achieve different dimensions for the extent of photoresist removed, and can be used according to the principles of the invention to result in different dimensions $S_1$ and $S_2$ as specified above.

The first level metal layer is shown at 35, spaced at distance S from the wafer edge. The second interlevel dielectric layer is shown at 36, deposited over the patterned first metal level 35, and spaced at distance $S_2$ from the edge of the wafer.

It is evident from FIG. 2 that the edges of the conductive levels are vertically aligned, but the edges are buried, in contrast to the structure of FIG. 1. It is also evident that this structure has a severe vertical step at 39, which is three times the step height required to cover the edge of a single metal layer. That step is reduced according to the invention using the process sequence shown in FIGS. 4–10.

The large step 39 in FIG. 2 is attributable to the common spacing $S_1$ of the photoresist from the wafer edge used in patterning the conductive layers. By staggering the spacing the step can be reduced, and the edges of each conductive layer can be further protected in the lateral plane during etching of subsequent layers. In the embodiments shown the step height is reduced to the step required for covering a single metal layers, i.e. by two thirds when compared with step height 39 in FIG. 2.

Figure 4:
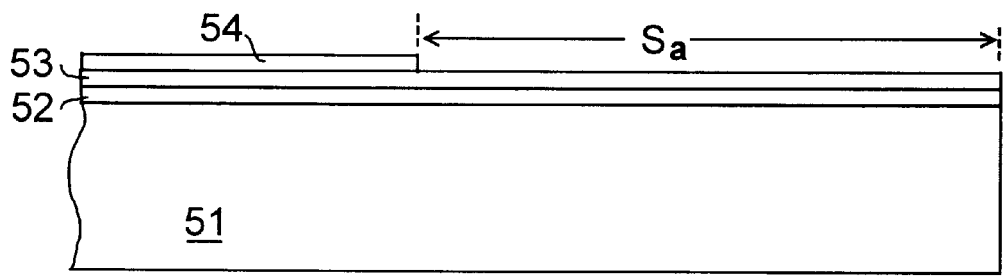
FIGS. 4–10 are schematic representations of a first embodiment of process steps used to form a tapered stack of metal layers according to the invention.
Figure 5:
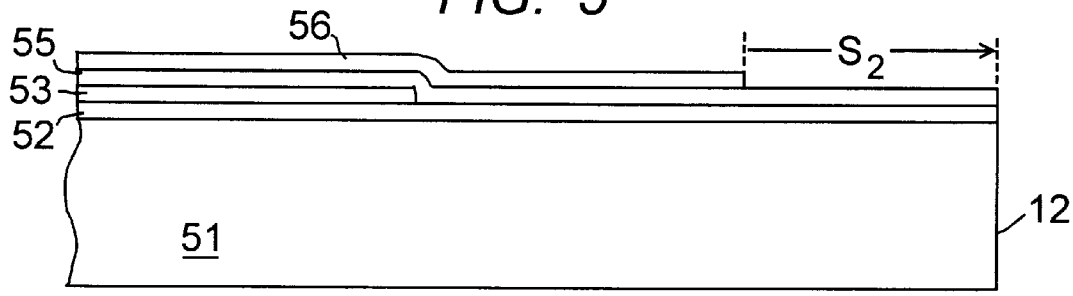

Referring to FIG. 4, the polysilicon layer 53, on field oxide 52, is patterned with photoresist layer 54. The peripheral region that is removed from photoresist layer 54 is defined by $S_a$, where $S_a$ is, for example, 3 mm. After etching layer 53, stripping photoresist layer 54, depositing the first interlevel dielectric layer 55, and masking the first interlevel dielectric layer with photomask 56, the edge of the photomask 56 for patterning dielectric layer 55 is spaced at a distance $S_2$ from the edge 12 of the wafer as shown in FIG. 5.

Figure 6:
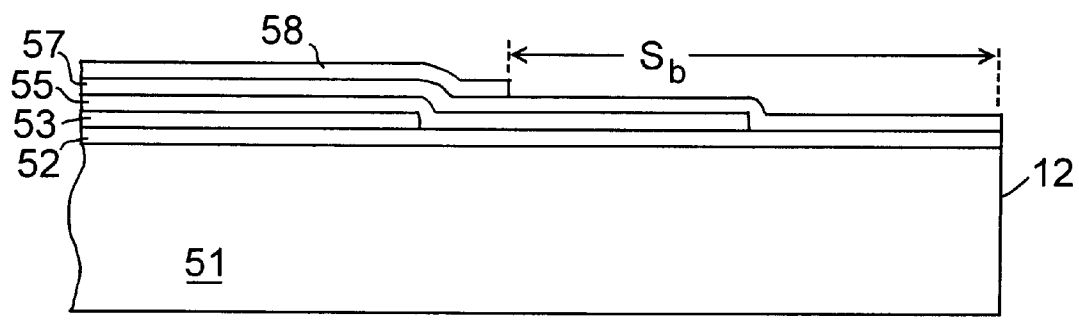
Figure 7:
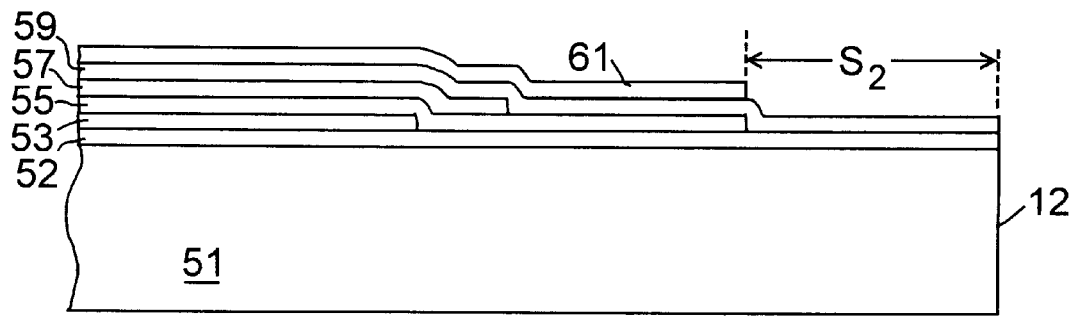
Figure 8:
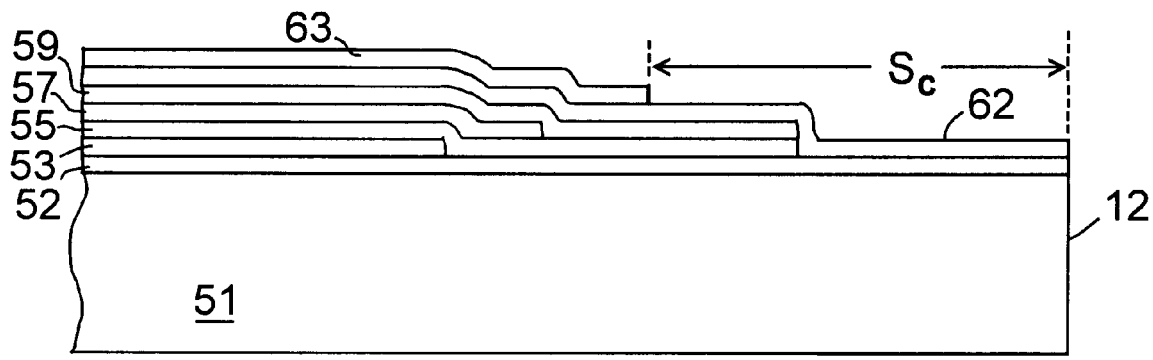
Figure 9:
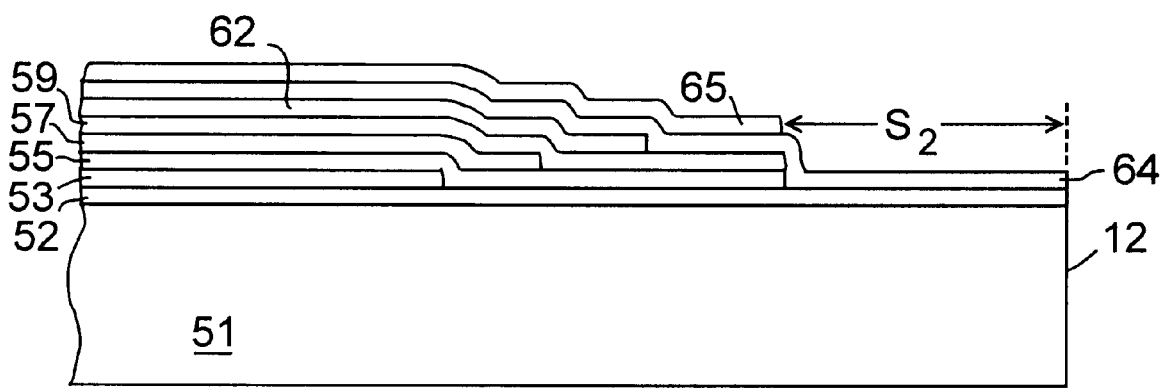
Figure 10:
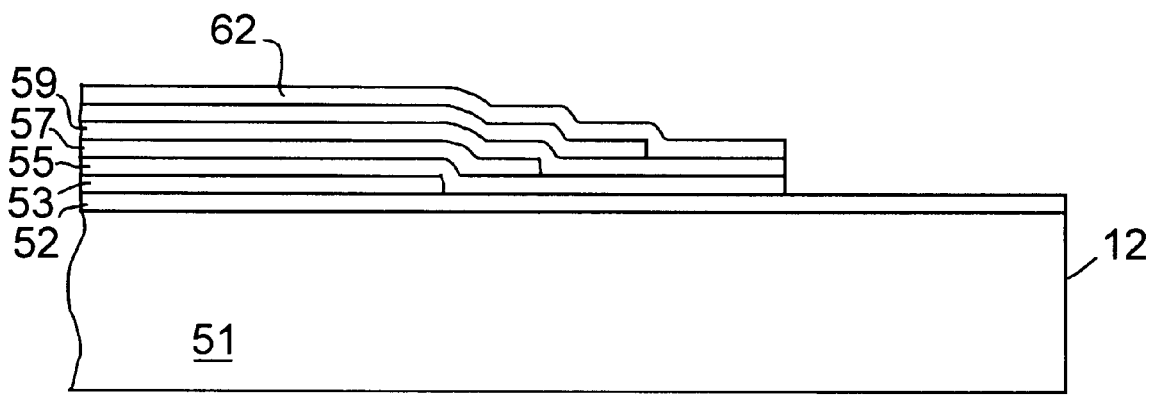

In FIG. 6 the first level metal layer 57 is shown blanket deposited over the first interlevel dielectric layer 55. The photoresist layer used for patterning the first level metal layer 57 is shown at 58 in FIG. 6. The edge of this photoresist layer is spaced at distance $S_b$ from the wafer edge 12, where $S_b<S_a$. For example, if $S_a$ is 3 mm, as was suggested previously, then $S_b$ can appropriately be 2.5 mm. FIG. 7 shows the first level metal layer 57 patterned, and the second interlevel dielectric layer 59 blanket deposited over the first metal level. The second interlevel dielectric layer is patterned using photoresist layer 61, the edge of which is spaced at distance $S_2$ from the wafer edge 12. With reference to FIG. 8, the last metal layer 62, the second level metal, is shown deposited over dielectric layer 59, and the photoresist layer used for patterning metal layer 62 is shown at 63. The edge of this photoresist layer is spaced at distance $S_c$ from the edge of the wafer, with $S_c<S_b$. With the numbers previously given for $S_a$ and $S_b$, a suitable dimension for $S_c$ is 2.0 mm. A suitable dimension for $S_2$ is 1.5 mm. It should be evident that the dimensions $S_a$, $S_b$, $S_c$ and $S_2$ in this embodiment are related by $S_a>S_b>S_c>S_2$. The top oxide layer 64 is then deposited and patterned using mask 65, spaced from the wafer edge at distance $S_2$. The final structure, with the edges of all three metal layers buried, and with the edges of the metal layers 53, 57 and 62 staggered along the wafer surface thus producing a graduated step in the topography as shown in FIG. 10. This can be contrasted with the multilayer metal stack shown in FIG. 2 which has a large step 39 at the edge of the wafer. It will be noted that the step in each dielectric layer is essentially the same, or in the more general case, the step height in each of the dielectric layers over the edge of the metal stack is no greater than the thickness of the underlying metal layer.

Figure 11:
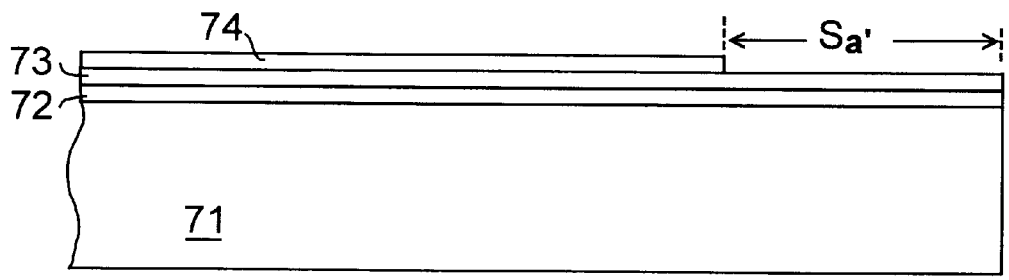
FIGS. 11–16 are schematic representations of another embodiment of process steps used to form a tapered stack of metal layers according to the invention.
Figure 12:
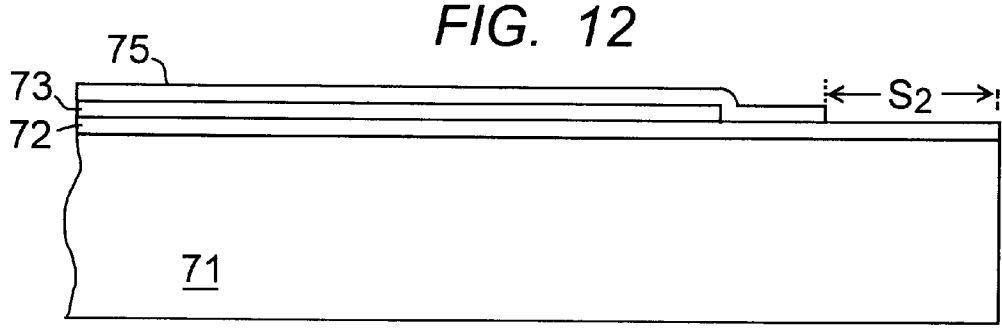

An alternative approach that produces essentially the same result, i.e. staggered buried edges for the multilevel metal stack is shown in FIGS. 11–16. Referring to FIG. 11, the polysilicon layer 73, on field oxide 72, is patterned with photoresist layer 74. The peripheral region that is removed from photoresist layer 74 is defined by $S_{a'}$, where $S_{a'}$ is, for example, 2 mm. After etching layer 73, stripping photoresist layer 74, depositing the first interlevel dielectric layer 75, and patterning the first interlevel dielectric layer with a photomask spaced at a distance $S_2$ from the edge 12 of the wafer, the resulting structure is shown in FIG. 12.

Figure 13:
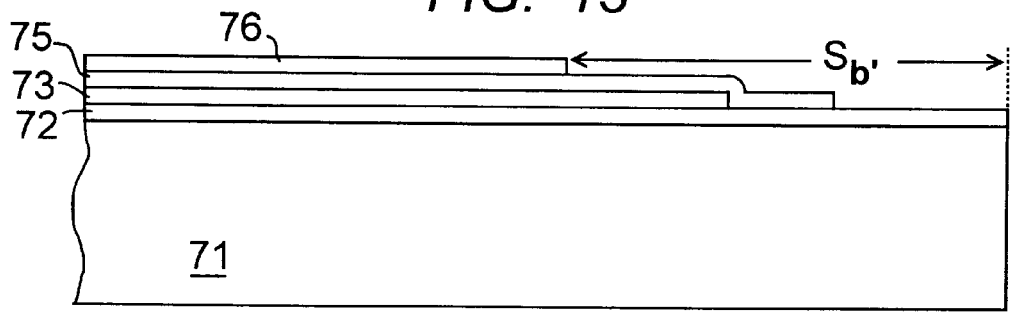
Figure 14:
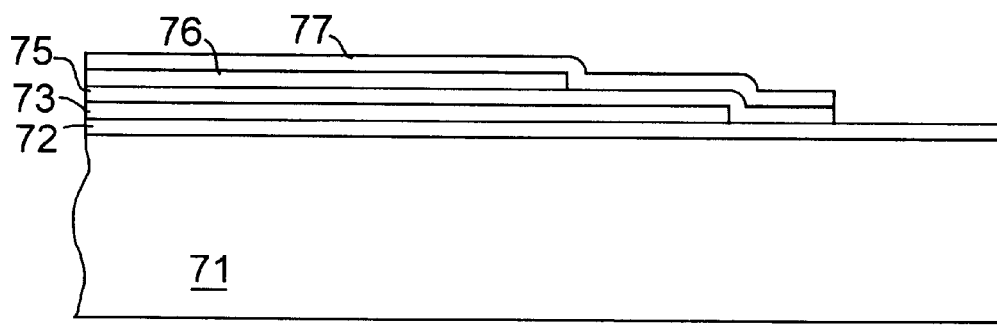
Figure 15:
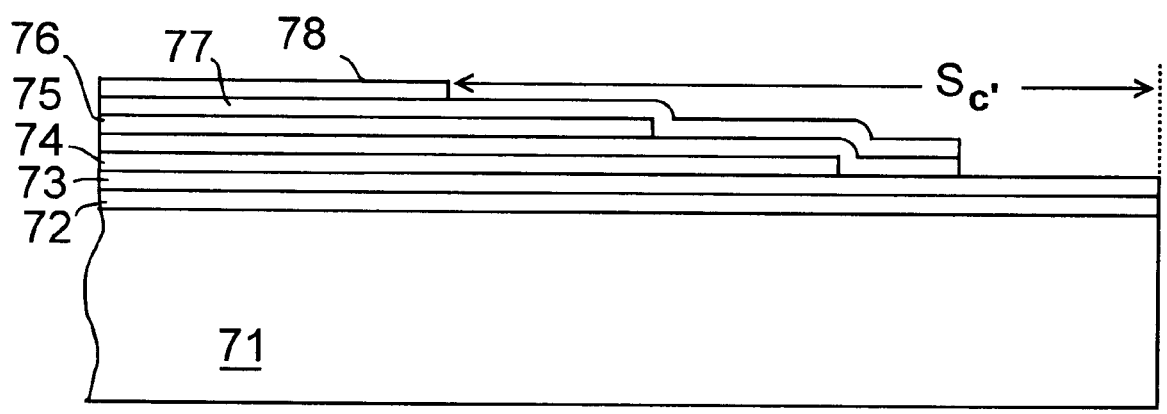
Figure 16:
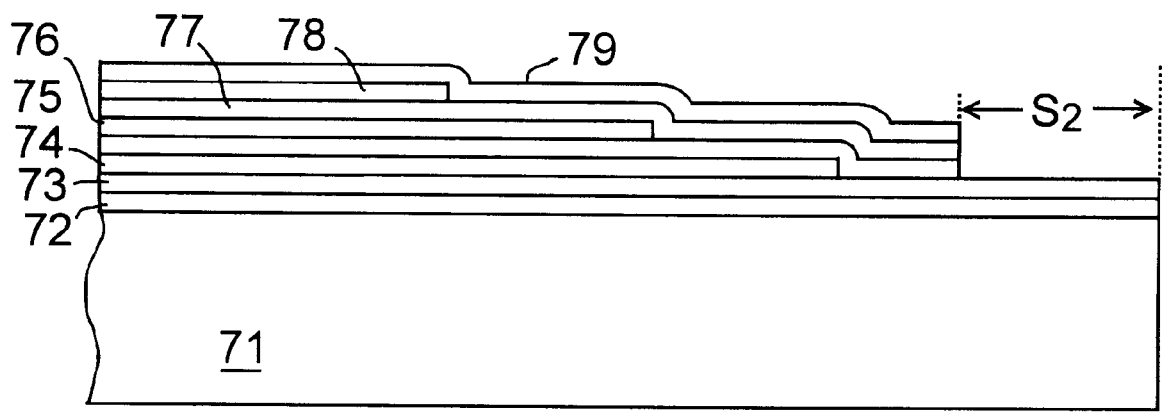

With reference to FIG. 13, the first level metal layer 76 is shown deposited over the first interlevel dielectric layer 75. The photoresist layer used for patterning the first level metal layer 76 is spaced at distance $S_{b'}$ from the wafer edge 12, where in this embodiment $S_{b'} > S_{a'}$. For example, if $S_{a'}$ is 2 mm, as was suggested previously, then $S_{b'}$ can appropriately be 2.5 mm. FIG. 14 shows the first level metal layer 76 patterned, and the second interlevel dielectric layer 77 deposited over the first metal level. The second interlevel dielectric layer is patterned using a photoresist layer spaced at distance $S_2$ from the wafer edge 12 as in FIG. 12. With reference to FIG. 15, the last metal layer 78, the second-level metal, is shown deposited over dielectric layer 77, and the photoresist layer used for patterning metal layer 62 is spaced at distance $S_{c'}$ from the edge of the wafer, with $S_{c'} > S_{b'}$. With the numbers previously given for $S_{a'}$ and $S_{b'}$, a suitable dimension for $S_{c'}$ is 3.0 mm. A suitable dimension for $S_2$ is 1.5 mm. It should be evident that the dimensions $S_{a'}$, $S_{b'}$, $S_{c'}$ and $S_2$ in this embodiment are related by $S_{c'} > S_{b'} > S_{a'} > S_2$. The top oxide layer 79 is then deposited and patterned using a mask spaced from the wafer edge at distance $S_2$. The final structure, with the edges of all three metal layers buried, and with the edges of the metal layers 74, 76 and 78 staggered along the wafer surface thus producing a graduated step in the topography as shown in FIG. 16. Again, this should be contrasted with the multilayer metal stack shown in FIG. 2 which has large step 39 at the edge of the wafer.

In the foregoing description the polysilicon layer is referred to in places as a metal layer since it is conductive, and debris at its edge potentially causes conductive particle defects. However, as indicated earlier a variety of metallization materials may be used. In silicon processing the metal levels are typically aluminum. However, in II–V and II–V processing other metals and metal alloys such as TiPtAu are used. The common quality of these materials that causes potential defects in the finished device is that they are electrically conductive.

The dielectric layers are typically oxides but may be other materials as earlier suggested. The thickness of these layers is conventional. In fact, the entire process described here is intended to follow established wafer fabrication processes except for a small adjustment in the edge features of the photolithography mask. Thus there are no added lithography or etch steps and consequently essentially no added cost.

As is evident from the foregoing description, an important aspect of the invention is the relative size of the edge portion of the photoresist layer that is removed during processing. The definition of the critical dimension is clearly understood with reference to the drawings. To provide a clear definition for this dimension, the size of the peripheral region of photoresist layer removed in the process is measured from the edge of the wafer along a diameter of the wafer to the edge of the photomask.

In the embodiment just described, each of the interlevel dielectric layers is spaced from the wafer edge by distance $S_2$, with $S_2$ assumed to be finite. It is also possible to achieve the objective of the invention, i.e. maintaining the edges of the conductive levels buried, in the case of $S_2$ equal to zero.

The dimensions $S_a$ $S_b$, $S_c$, and the dimensions $S_{a'}$, $S_{b'}$ and $S_{c'}$ are, as described, different. To reach the objectives of the invention the difference should be at least three times the thickness of the metal layers.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A process for the manufacture of semiconductor integrated circuit wafers comprising the steps of:

a. forming a first dielectric layer on a semiconductor substrate, b. depositing a first conductive layer on said first dielectric layer, c. photolithographically masking said first conductive layer using a photomask, d. etching away portions of said first conductive layer exposed by said photomask to pattern said first conductive layer, said portions including a peripheral region of said first conductive layer around the perimeter of the wafer thereby forming a peripheral edge of said first conductive layer spaced from the edge of said wafer, said peripheral region having a dimension $S_a$, as measured from the edge of the wafer along the diameter of the wafer to the peripheral edge of the first conductive layer, e. depositing a second dielectric layer over the patterned first conductive layer, f. photolithographically masking said second dielectric layer using a photomask, g. etching away portions of said second dielectric layer exposed by said photomask to pattern said second dielectric layer, said portions including a peripheral region of said second dielectric layer around the perimeter of the wafer, said peripheral region having a dimension $S_2$, as measured from the edge of the wafer along the diameter of the wafer to the peripheral edge of said second dielectric layer, h. depositing a second conductive layer over the patterned second dielectric layer, i. photolithographically masking said second conductive layer using a photomask, j. etching away portions of said second conductive layer exposed by said photomask to pattern said second conductive layer, said portions including a peripheral region of said second conductive layer around the perimeter of the wafer thereby forming a peripheral edge of said second conductive layer spaced from the edge of said wafer, said peripheral region having a dimension $S_b$, as measured from the edge of the wafer along the diameter of the wafer to the peripheral edge of the second conductive layer, k. depositing a third dielectric layer over the patterned second conductive layer, said third dielectric layer extending over the said peripheral edge of the second conductive layer, said dimensions $S_a$, $S_b$, and $S_2$, being related by $S_a > S_b > S_2$ so that the step height in the third dielectric layer is no greater than the thickness of the second conductive layer.

2. The process of claim 1 wherein dimension $S_2$ is approximately zero.

3. A process for the manufacture of semiconductor integrated circuit wafers comprising the steps of:
   a. forming a first dielectric layer on a semiconductor substrate,
   b. depositing a first conductive layer on said first dielectric layer,
   c. photolithographically masking said first conductive layer using a photomask,
   d. etching away portions of said first conductive layer exposed by said photomask to pattern said first conductive layer, said portions including a peripheral region of said first conductive layer around the perimeter of the wafer thereby forming a peripheral edge of said first conductive layer spaced from the edge of said wafer, said peripheral region having a dimension $S_a$, as measured from the edge of the wafer along the diameter of the wafer to the peripheral edge of the first conductive layer,
   e. depositing a second dielectric layer over the patterned first conductive layer,
   f. photolithographically masking said second dielectric layer using a photomask,
   g. etching away portions of said second dielectric layer exposed by said photomask to pattern said second dielectric layer, said portions including a peripheral region of said second dielectric layer around the perimeter of the wafer, said peripheral region having a dimension $S_2$, as measured from the edge of the wafer along the diameter of the wafer to the peripheral edge of said second dielectric layer,
   h. depositing a second conductive layer over the patterned second dielectric layer,
   i. photolithographically masking said second conductive layer using a photomask,
   j. etching away portions of said second conductive layer exposed by said photomask to pattern said second conductive layer, said portions including a peripheral region of said second conductive layer around the perimeter of the wafer thereby forming a peripheral edge of said second conductive layer spaced from the edge of said wafer, said peripheral region having a dimension $S_b$, as measured from the edge of the wafer along the diameter of the wafer to the peripheral edge of the second conductive layer,
   k. depositing a third dielectric layer over the patterned second conductive layer, said third dielectric layer extending over the said peripheral edge of the second conductive layer, said dimensions $S_a$, $S_b$, and $S_2$, being related by $S_b > S_a > S_2$ so that the step height in the third dielectric layer is no greater than the thickness of the second conductive layer.

4. The process of claim 3 wherein dimension $S_2$ is approximately zero.

5. A process for the manufacture of semiconductor integrated circuit wafers comprising the steps of:
   a. forming a first dielectric layer on a semiconductor substrate,
   b. depositing a first conductive layer on said first dielectric layer,
   c. photolithographically masking said first conductive layer using a photomask,
   d. etching away portions of said first conductive layer exposed by said photomask to pattern said first conductive layer, said portions including a peripheral region of said first conductive layer around the perimeter of the wafer thereby forming a peripheral edge of said first conductive layer spaced from the edge of said wafer, said peripheral region having a dimension $S_a$, as measured from the edge of the wafer along the diameter of the wafer to the peripheral edge of the first conductive layer,
   e. depositing a second dielectric layer over the patterned first conductive layer,
   f. photolithographically masking said second dielectric layer using a photomask,
   g. etching away portions of said second dielectric layer exposed by said photomask to pattern said second dielectric layer, said portions including a peripheral region of said second dielectric layer around the perimeter of the wafer, said peripheral region having a dimension $S_2$, as measured from the edge of the wafer along the diameter of the wafer to the peripheral edge of said second dielectric layer,
   h. depositing a second conductive layer over the patterned second dielectric layer,
   i. photolithographically masking said second conductive layer using a photomask,
   j. etching away portions of said second conductive layer exposed by said photomask to pattern said second conductive layer, said portions including a peripheral region of said second conductive layer around the perimeter of the wafer thereby forming a peripheral edge of said second conductive layer spaced from the edge of said wafer, said peripheral region having a dimension $S_b$, as measured from the edge of the wafer along the diameter of the wafer to the peripheral edge of the second conductive layer,
   k. depositing a third dielectric layer over the patterned second conductive layer,
   l. photolithographically masking said third dielectric layer using a photomask,
   m. etching away portions of said third dielectric layer exposed by said photomask to pattern said third dielectric layer, said portions including a peripheral region of said third dielectric layer around the perimeter of the wafer, said peripheral region having said dimension $S_2$, so that the portions of said third dielectric layer remaining after the etch step cover the peripheral edge of said second conductive layer,
   n. depositing a third conductive layer over the patterned third dielectric layer,
   o. photolithographically masking said third conductive layer using a photomask,
   p. etching away portions of said third conductive layer exposed by said photomask to pattern said third conductive layer, said portions including a peripheral region of said third conductive layer around the perimeter of the wafer thereby forming a peripheral edge of said third conductive layer spaced from the edge of said wafer, said peripheral region having said dimension $S_C$,
   q. depositing a fourth dielectric layer over the patterned third conductive layer, said fourth dielectric layer extending over the said peripheral edge of said third conductive layer, said dimensions $S_a$, $S_b$, $S_c$, and $S_2$, being related by $S_a>S_b>S_c>S_2$ so that the step height in the fourth dielectric layer is no greater than the thickness of the third conductive layer.

6. The process of claim 5 wherein dimension $S_2$ is approximately zero.

7. A process for the manufacture of semiconductor integrated circuit wafers comprising the steps of:

a. forming a first dielectric layer on a semiconductor substrate, b. depositing a first conductive layer on said first dielectric layer, c. photolithographically masking said first conductive layer using a photomask, d. etching away portions of said first conductive layer exposed by said photomask to pattern said first conductive layer, said portions including a peripheral region of said first conductive layer around the perimeter of the wafer thereby forming a peripheral edge of said first conductive layer spaced from the edge of said wafer, said peripheral region having a dimension $S_a$, as measured from the edge of the wafer along the diameter of the wafer to the peripheral edge of the first conductive layer, e. depositing a second dielectric layer over the patterned first conductive layer, f. photolithographically masking said second dielectric layer using a photomask, g. etching away portions of said second dielectric layer exposed by said photomask to pattern said second dielectric layer, said portions including a peripheral region of said second dielectric layer around the perimeter of the wafer, said peripheral region having a dimension $S_2$, as measured from the edge of the wafer along the diameter of the wafer to the peripheral edge of said second dielectric layer, h. depositing a second conductive layer over the patterned second dielectric layer, i. photolithographically masking said second conductive layer using a photomask, j. etching away portions of said second conductive layer exposed by said photomask to pattern said second conductive layer, said portions including a peripheral region of said second conductive layer around the perimeter of the wafer thereby forming a peripheral edge of said second conductive layer spaced from the edge of said wafer, said peripheral region having a dimension $S_b$, as measured from the edge of the wafer along the diameter of the wafer to the peripheral edge of the second conductive layer, k. depositing a third dielectric layer over the patterned second conductive layer, l. photolithographically masking said third dielectric layer using a photomask, m. etching away portions of said third dielectric layer exposed by said photomask to pattern said third dielectric layer, said portions including a peripheral region of said third dielectric layer around the perimeter of the wafer, said peripheral region having said dimension $S_2$, so that the portions of said third dielectric layer remaining after the etch step cover the peripheral edge of said second conductive layer, n. depositing a third conductive layer over the patterned third dielectric layer, o. photolithographically masking said third conductive layer using a photomask, p. etching away portions of said third conductive layer exposed by said photomask to pattern said third conductive layer, said portions including a peripheral region of said third conductive layer around the perimeter of the wafer thereby forming a peripheral edge of said third conductive layer spaced from the edge of said wafer, said peripheral region having said dimension $S_C$, q. depositing a fourth dielectric layer over the patterned third conductive layer, said fourth dielectric layer extending over the said peripheral edge of said third conductive layer, said dimensions $S_a$, $S_b$, $S_c$, and $S_2$ being related by $S_c>S_b>S_a>S_2$ so that said third conductive layer and said fourth dielectric layer cover the peripheral edge of said second conductive layer, and said second conductive layer and said third dielectric layer cover the peripheral edge of said first conductive layer, and further so that the step height in the fourth dielectric layer is no greater than the thickness of the third conductive layer.

8. The process of claim 7 wherein dimension $S_2$ is approximately zero.

9. The process of claim 5 wherein the dimensions $S_2$, $S_a$, $S_b$, and $S_c$ are in the range 1–10 mm.

10. The process of claim 7 wherein the dimensions $S_2$, $S_a$, $S_b$, and $S_c$ are in the range 1–10 mm.

11. The process of claim 5 wherein the semiconductor wafer is silicon and the first and second dielectric layers comprise $SiO_2$.

12. The process of claim 7 in which the said first conductive layer is polysilicon.

* * * * *